US008457910B2

(12) United States Patent
Muthu-Manivannan et al.

(10) Patent No.: US 8,457,910 B2
(45) Date of Patent: Jun. 4, 2013

(54) ELECTRICAL POWER SYSTEM EVENT DETECTION AND ANTICIPATION

(75) Inventors: Karthick Muthu-Manivannan, College Station, TX (US); Carl L. Benner, Bryan, TX (US); Peng Xu, College Station, TX (US); Billy Don Russell, College Station, TX (US)

(73) Assignee: The Texas A&M University System, College Station, TX (US)

( * ) Notice: Subject to any disclaimer, the term of this patent is extended or adjusted under 35 U.S.C. 154(b) by 865 days.

(21) Appl. No.: 11/950,917

(22) Filed: Dec. 5, 2007

(65) Prior Publication Data

US 2009/0150686 A1   Jun. 11, 2009

(51) Int. Cl.
   *G01R 31/00*   (2006.01)
(52) U.S. Cl.
   USPC .............. 702/60; 702/58; 702/185; 700/286
(58) Field of Classification Search
   USPC .............. 702/58–62, 64–66; 700/286, 287, 700/292–294; 324/500, 509, 512, 522
   See application file for complete search history.

(56) References Cited

U.S. PATENT DOCUMENTS

| 4,466,071 | A | 8/1984 | Russell |
| 5,485,093 | A * | 1/1996 | Russell et al. ................ 324/522 |
| 5,506,789 | A | 4/1996 | Russell et al. |
| 5,512,832 | A | 4/1996 | Russell et al. |
| 5,550,751 | A | 8/1996 | Russell et al. |
| 5,578,931 | A | 11/1996 | Russell et al. |
| 5,600,526 | A | 2/1997 | Russell et al. |
| 5,659,453 | A | 8/1997 | Russell et al. |
| 5,819,203 | A | 10/1998 | Moore et al. |
| 5,966,675 | A * | 10/1999 | Koeck ............................. 702/58 |
| 6,195,241 | B1 | 2/2001 | Brooks et al. |
| 6,535,797 | B1 | 3/2003 | Bowles et al. |
| 6,577,484 | B1 | 6/2003 | MacBeth et al. |
| 6,907,320 | B2 * | 6/2005 | Nagafuchi et al. ............ 700/292 |
| 2003/0074498 | A1 * | 4/2003 | Gareis et al. .................... 710/36 |

OTHER PUBLICATIONS

M.B. Duric, Z.M. Radojevic, and V.V. Terzija, "Time domain solution of arcing faults detection and fault distance calculation on distribution lines", : in Proc. CIRED 97, Jun. 1997, pp. 1.1.1-1.1.5.

* cited by examiner

*Primary Examiner* — Manuel L Barbee
(74) *Attorney, Agent, or Firm* — Trego, Hines & Ladenheim, PLLC

(57) ABSTRACT

A method for analyzing an electrical power system includes analyzing data representing a signal of interest of the power system, the data containing at least one power system event; and based on the analysis, associating the power system event with a root cause. A computer program product is also provided for carrying out the method.

18 Claims, 2 Drawing Sheets

ELECTRICAL POWER SYSTEM EVENT DETECTION AND ANTICIPATION

BACKGROUND OF THE INVENTION

The present invention relates generally to a method for analyzing a first signal indicative of a property of an electrical utility power system, and more particularly to a method for determining the cause of a power system event.

Generally, electrical power originates at a generation station and is transmitted to a load by a system of conductors and other equipment that make up an electrical power system. The equipment that makes up an electric power system can include switches, reclosers, insulators, capacitors, and the like. Over time, or as the result of some particular cause such as contact of a conductor by vegetation, apparatus can cease to operate normally or fail. Sometimes a failure of apparatus results in an abnormally high current that can further damage the power system or injure end users or damage end use devices and equipment. Failures also sometimes result in degraded power quality or loss of electric service.

There are known devices within an electric power system that can function to protect the system and end users from high current. For example, a relay or recloser may be configured to operate to interrupt current flow when the amplitude of the current exceeds a minimum threshold for a minimum duration. When a threshold is met, the device operates and power is interrupted. In many cases the device operates to restore power after a predetermined time period has elapsed. If the failure is still present, a threshold may be met and power interrupted again. In this manner several power interruptions can result from the same cause, either in close succession or spread over an indeterminate period of time. In other cases, failure of a particular apparatus is the actual cause of the power outage and the power remains interrupted until a repair or replacement is made. In some other cases, the faulty apparatus may continue to operate in an abnormal fashion without causing any outage but instead may cause disturbances that may affect the normal functioning of other equipment present in the power system.

When an outage occurs, failing or failed apparatus often must be repaired or replaced before normal, reliable service can be restored. Temporary faults may be cleared and electrical power restored by normal operation of a protective device, i.e., a recloser. However, if the underlying failure or condition remains, power may be interrupted again, either immediately or after an indeterminate amount of time. When sustained outages occur, electrical power system operators such as utility companies must make repairs, and these repairs often must be made at times and under conditions that cause additional difficulties and expense in manpower and equipment. Repairs made in this manner are often more troublesome and expensive than if they could have been planned in advance. In addition, if repairs can be made before a power outage occurs, overall service is more reliable and of higher quality, and inconveniences and economic losses to end users may be minimized or avoided. Therefore it is desirable to identify failures, incipient failures, and other improper or suboptimal operation of power system apparatus before these conditions affect power quality or cause momentary interruptions or sustained power outages.

Utilities may utilize conventional methods to reduce the number of power interruptions and outages that occur. Conventional methods include a) physically examining and/or testing individual apparatus periodically in an effort to determine whether they are likely to fail and cause a power outage or power quality problems and b) replacing apparatus according to a predetermined schedule. Problems exist with both of these approaches. One significant problem is that examining, testing, and/or replacing large numbers of individual devices can be time-consuming, expensive, and difficult to schedule without interrupting power to the end users. A problem with the second approach is that, when apparatus are replaced according to a predetermined schedule, they may be replaced when they are functioning normally, well before any failure actually begins. Alternatively, they may not be replaced in time to avoid an outage. Further periodic maintenance or replacements actually can inadvertently introduce problems that did not previously exist. Clearly it would be preferable to know when apparatus are beginning to deteriorate or operate improperly or sub optimally, so that repairs or replacements could be made prior to actual failure.

In an effort to identify failing or failed devices, utilities may monitor the operation of an electrical power system by monitoring one or more signal indicative of properties such as current. However, conventional methods of monitoring properties of a power system are generally unable to determine that devices are failing before a power interruption or outage occurs. One reason is that conventional methods are generally unable to distinguish relatively small changes that failing apparatus may cause from normal deviations of the property. Another problem with conventional monitoring methods is that human experts skilled in the art of using monitored properties to identify failed or failing devices generally must analyze real-time or near real-time data obtained from a power system. These experts may not be available for analysis when needed and analysis can be expensive and error prone. Yet another problem with conventional methods is that much of the data collected may correspond to normal day-to-day operations of the power system, while only a very small fraction of data thus collected will correspond to abnormal operations caused by failing or failed apparatus. It may not be feasible to manually analyze such huge amounts of data in a timely and reliable fashion.

BRIEF SUMMARY OF THE INVENTION

These and other shortcomings of the prior art are addressed by the present invention, which according to one aspect provides a method for analyzing an electrical power system, including: (a) analyzing data representing a signal of interest of the power system, the data containing at least one power system event; and (b) based on the analysis, associating the power system event with a root cause.

According to another aspect of the invention, a computer program product includes one or more computer readable media having stored thereon a plurality of instructions that, when executed by one or more processors of a system, causes the one or more processors to: (a) analyze data representing a signal of interest of an electrical power system, the data containing at least one power system event; and (b) based on the analysis, associate the power system event with a root cause.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
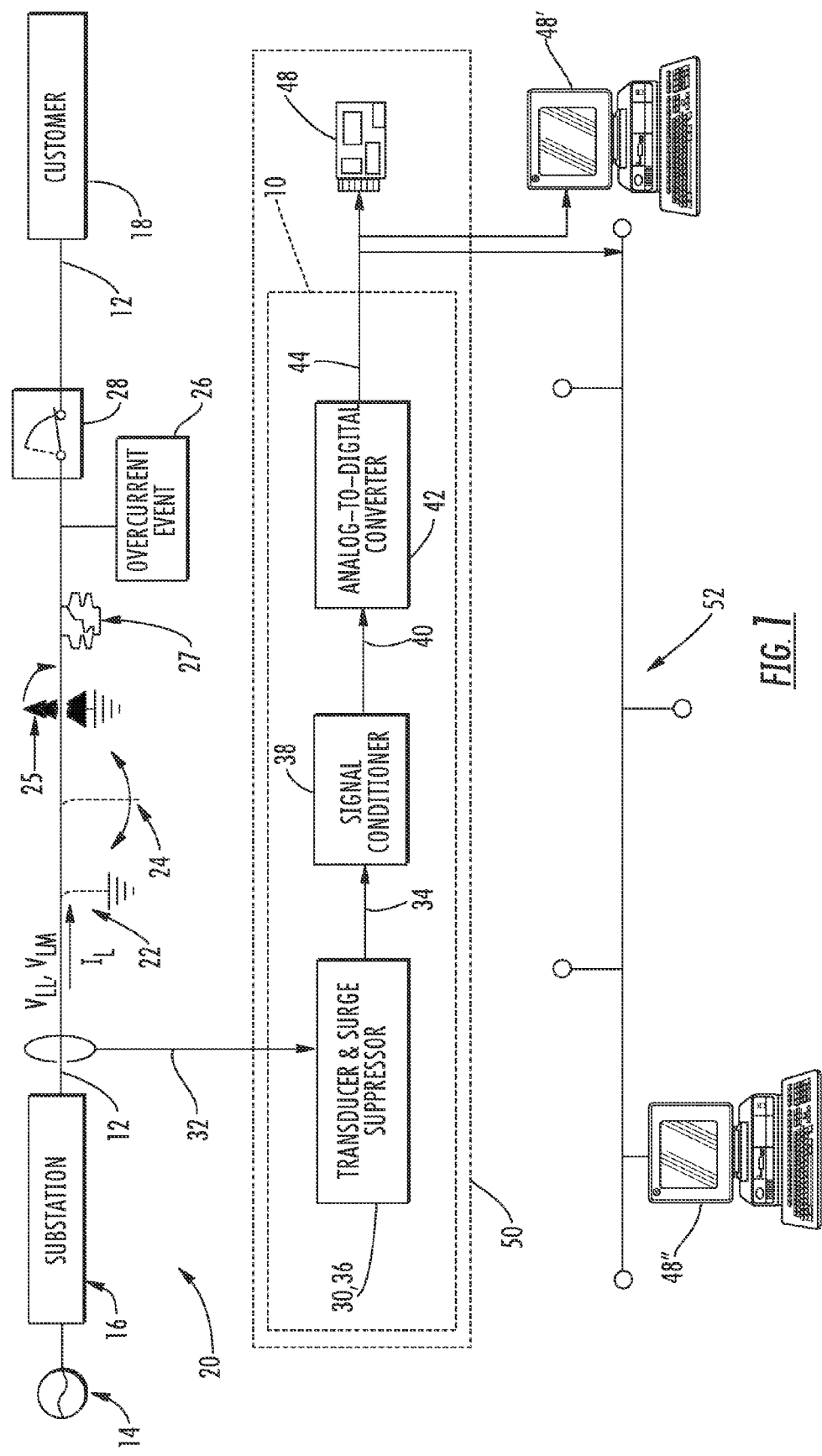
FIG. 1 is a schematic block diagram of a monitoring system for an electric power distribution system constructed according to one aspect of the present invention.

Referring to the drawings wherein identical reference numerals denote the same elements throughout the various views, an exemplary power system event detection and anticipation system constructed according to an aspect of the present invention is illustrated in FIG. 1, coupled to a feeder line 12 of an electrical power system. The feeder line 12 receives power from a power source, such as a generating station 14, through a substation 16. Other feeder lines (not shown) may also receive power from the generating station 14 and exit the substation 16. The feeder line 12 delivers power from the substation 16 to a variety of customers, such as customer 18.

Altogether, the generating station 14, the substation 16, and feeder line 12 illustrate a portion of an electrical utility's power system. As used herein, the term "line" refers to one or more conductors grouped together for conducting electrical power from a first point to a second point. As used herein, the term "conductor" refers to a material that provides a path for electricity and includes a wire, a group of wires, or other conductive material.

Although the invention is described as implemented in an electrical power distribution system, it will be understood that it may be implemented in any portion of an electric power system, including but not limited to generating stations, substations, transmission lines, primary and secondary distribution lines, and customer facilities.

Most typical power systems generate and distribute power using a three-phase system. Thus, the feeder line 12 may deliver power over three conductors that each conducts a phase A, B, or C. The feeder line 12 may also have a fourth conductor which is referred to as the neutral. For convenience, power system 20 illustrated herein is such a three-phase system that includes a neutral conductor.

In the illustrated example, the failure anticipation system includes a data acquisition unit 10, which is shown at a substation 16 in the illustrated embodiment. It is noted that the power system event detection system and method of the present invention need not include the data acquisition unit 10, but may instead be implemented as software and/or hardware which analyzes data provided from an outside source, such as existing measurement equipment. The present invention may be used at any location within a system of power lines, i.e. generating stations, substations, transmission lines, primary and secondary distribution lines, and customer facilities. Furthermore, multiple data acquisition units 10 can be placed at selected intervals in one or more locations of interest in a power system. For example, data acquisition units 10 could be placed at a substation as well as spread along a line at various distances from a substation such as at 2, 4, 6, and 8 miles from the substation. This "sectionalization" may be useful in determining the specific location of a fault. In this regard, if a fault occurs between miles 4 and 6 from a substation, differences in the signals generated by the data acquisition units 10 positioned at miles 4 and 6 may be useful for determining where the fault occurred relative to miles 4 and 6.

Between the substation 16 and the customer 18, the feeder line 12 may be subject to a variety of different types of events, conditions, activities, and faults. Some typical events, conditions, activities, and faults are illustrated in FIG. 1, specifically, a downed conductor 22, a dangling conductor 24, contact of vegetation such as a tree 25 or other object with the feeder line 12, and a broken insulator 27. The system may also be subject to other disrupting events, such as an overcurrent event 26 or a switching event performed by a conventional recloser 28 or the like. In addition to conventional faults, the electrical power system is also subject to mis-operation or partial failure of components. For example, devices such as a switching controller for a capacitor bank or a tap changer for a transformer can enter a failure mode in which switching occurs too often. This can cause unacceptable power quality for the customer 18 and wear out the switching equipment, which eventually damages the switching equipment and/or related equipment.

The data acquisition unit 10 includes a monitoring device, such as a sensor or transducer 30, coupled to feeder line 12 as indicated schematically by line 32. The term "monitoring device" is broadly defined herein to include sensing devices, detecting devices, and any other structurally equivalent device or system understood to be interchangeable therewith by those skilled in the art. The illustrated transducer 30 senses or monitors several line parameters, such as line voltages for each phase (line-to-line $V_{LL}$ or line-to-neutral $V_{LN}$), or load current ($I_L$) flowing through line 12 for each phase conductor or neutral conductor. Any subset of the 6 voltages or 4 currents measurable in a three-phase system may be monitored. The present invention may also be used with single-phase systems. For instance, in response to monitoring a load current $I_L$ and a line-to-neutral (phase) voltage, transducer 30 produces a parameter signal, here, a signal 34 that is indicative of dual load current and phase voltage. The transducer 30 may be a conventional transducer or an equivalent device, such as a multiple phase current measuring device typically having one current transformer per phase, plus one on the neutral conductor, of the feeder line 12, and a multiple phase voltage measuring device, measuring the line-to-neutral voltages for each phase of line 12. Moreover, the data acquisition unit 10 may receive transducer signals from already existing current and voltage sensors. For example, if only a single phase of the voltage is measured by transducer 30 or another transducer (not shown), the data acquisition unit 10 may be equipped with conventional hardware or software of a known type to derive the other two phases. That is, knowing one phase voltage on a three-phase system, the other two phases may be obtained by applying the appropriate plus/minus appropriate (e.g., 120°) phase shift to the monitored phase voltage. It is also conceivable that other parameters, e.g. power factor, of the power flowing through line 12 may be measured with suitable transducers.

The data acquisition unit 10 may also include surge protection, for example, a surge suppressor or protector 36. The surge protector 36 may be supplied either with the transducer 30, as illustrated, or as a separate component. The surge protector 36 protects the data acquisition unit 10 from power surges on the feeder line 12, such as those caused by lightning strikes or the like.

The data acquisition unit 10 may include a signal conditioner 38 for filtering and amplifying the signal 34 to provide a clean, conditioned signal 40. Preferably, the signal conditioner 38 includes one or more filters (e.g. low-pass, band-pass, high-pass, notch) for removing frequency components not of interest for the analysis such as signal noise. The data acquisition unit 10 may be used with a single frequency in the spectrum, or a combination of frequencies.

The signal conditioner 38 may also amplify the parameter signals 34 for the appropriate range required by an analog-to-digital (A/D) converter 42. For example, the current flowing on the power system 20 may have a dynamic range of 10 to 10,000 Amps, which transducer 30 may convert into a time-varying voltage signal of, for example, +/−25 volts, whereas the A/D converter 42 may accept voltages of +/−10 volts. In this case the signal conditioner 38 appropriately converts and scales these signals for conversion by the A/D converter 42 from an analog signal 40 into a digital parameter signal 44.

When the transducer 30 is an analog device, the data acquisition unit 10 includes the illustrated discrete A/D converter 42. The transducer 30 may also be implemented as a digital device which incorporates the signal conditioning function of conditioner 38 and the analog-to-digital conversion function of the A/D converter 42.

The digital parameter signal 44 is supplied to a computing device for analysis. An example of a suitable computing device includes a conventional microcomputer (sometimes referred to as a personal computer or "PC"). However, any device capable of executing a program instruction set to analyze the digital parameter signal may be used. As shown in FIG. 1, a computing device 48 such as a "single board computer" is directly connected to the data acquisition unit 10 and may be placed inside a common housing or container with the data acquisition unit 10, or otherwise integrated with the data acquisition unit 10, to form a self-contained detection and analysis unit 50. Alternatively or in addition to the computing unit 48, an external computing unit 48' may be connected to the data acquisition unit 10 using a direct connection such as a serial or parallel cable, wireless link, or the like. Furthermore, the data acquisition unit 10 may be connected to a remote computing unit 48" through a network 52 e.g., a local area network (LAN), a wide area network (WAN), or the Internet. Also, it is noted that the analysis method described herein may be integrated into existing systems which already include data collection and/or processing capability. For example, known types of relays, power quality meters, and other equipment used in power transmission or distribution often contain microprocessor-based electronics suitable for performing the analysis.

The present invention shall now further be described with reference to the operation of data acquisition unit 10 and computing device 48. It should be appreciated that operation of the power system with the data acquisition unit 10 generates a large amount of data. For example, a sampling system that is designed to sample a signal from a power system that is operating at a nominal frequency of 60 Hertz, at 256 samples per cycle, generates 15,360 samples per second. Continuous detailed analysis of this data stream is generally unnecessary and is an inefficient use of computing resources.

Optionally, the method of the present invention may include monitoring the continuous data stream. During operation, the digital parameter signal 44 (or data representing some or all of that signal) is continuously monitored and evaluated according to one or more selection criteria. The reason driving the selection criteria may be based on computing resource constraints, or on the existence of known patterns or features in the data that are more likely to be power system events, rather than steady-state operation. As used herein, the term "power system event" is used to refer to any deviation from steady-state operation which is deemed to be significant for analytical purposes. Non-limiting examples of power system events include actual or incipient equipment failures, as well as normal operational events. An example of a selection criterion would be a simple limit value in a measured or derived parameter. For example, if a root-mean-square (RMS) current in one or more phases on a power system exceeds a predetermined threshold level, this could indicate the presence of a fault current which exceeds normal system load (a type of power system event). Other types of criteria, such as a limit value on allowable deviation of a measured quantity from its estimated nominal value, matching observed data to templates representative of certain kinds of failures or incipient failures, could also be used.

Figure 2:
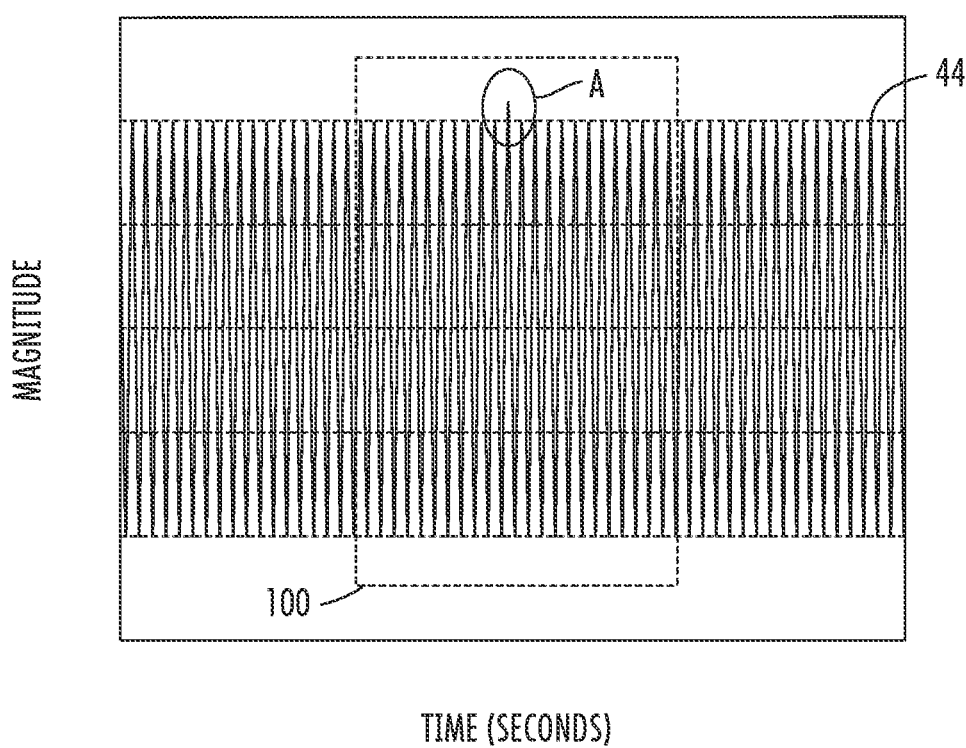
FIG. 2 is a schematic chart showing a power system parameter signal with a buffer window superimposed thereon.

When one or more of the selection criteria are met, the data being observed is referred to as a "power system event," as noted above. In response to the power system event, the computing device 48 logs a "snapshot" or "data window" of the parameter signal 44, for example by logging the digital parameter signal 44 to a data file. FIG. 2 graphically illustrates a parameter signal 44 with a power system event at "A". It should be noted that even though FIG. 2 shows data from a single parameter signal, a "data window" may represent the data corresponding to multiple parameters such as currents, voltages and other derived signals. A data window 100 of a selected width is superimposed on the signal 44. The size of the data window 100 is selected to provide a satisfactory sample for the chosen type of analysis, described in more detail below. For example, when a power system occurs, a data window 100 of one second of data prior to and five seconds of data subsequent to the power system event could be written to a file. It is also possible that such a data window could directly be processed by an algorithm without the need for storing in a file.

A data buffer of a known type may be employed to allow more detailed analysis. For example, a buffer of five-second duration may be superimposed on the signal 44. The data may be temporarily stored while it occupies the buffer. When the power system event A triggers the selection criteria, the entire contents of the buffer are recorded as the data window. For example, as shown in the example of FIG. 2, the power system event A occurs approximately halfway through the data window 100. Thus, the data window 100 captures the parameter signal 44 for approximately 2.5 seconds after the power system event A (post event data), and 2.5 seconds before the event A (pre event data). The above example is meant for illustrative purposes only. The size of the data window and the duration of pre event and post event data captured can be made configurable and may change based on the nature of the event.

When a power system event occurs, contextual data may also be logged along with the parameter signal 44. As used herein, the term "contextual data" is generally indicative of data other than the electrical data associated with the electrical power system that can be used to associate the data window 100 with a particular type of failure or lack thereof. By way of example and not limitation, contextual data can include one or more of the following: weather, e.g. the presence of precipitation, wind, lightning strikes or similar phenomenon; relative humidity; the presence or absence of particulate matter; the type, age, or physical condition of a known device on feeder line 12; or the time of occurrence of the power system event. Such data would be collected from known types of sensors, for example from an automated weather station associated with the power system.

Once the data window 100 has been logged, it is analyzed to determine the root cause of the power system event (for example, an incipient or actual failure or a significant normal power system operation). As used herein, the term "failure" refers to those events conventionally referred to as "faults" wherein unintended electrical current, or fault current, flows through the electrical power system, as well as events in which one or more parts of the electrical power system have failed or are operating in a less-than-optimal manner. A failure can be caused by a device that has failed completely or is beginning to fail. Such abnormal operation may result in electric service from the power system having poor quality that is indicated through variations of the parameter signal 44.

The exact type of analysis is not critical to the present invention, and more than one type of analysis may be used. Without limitation, examples of analysis include: examination of RMS voltage or current levels, temporal or spectral analysis of voltage or current waveforms, fuzzy logic analysis, Bayesian network based analysis, etc. The analysis may be performed on one or more directly measured parameters and/or on one or more derived parameters. A key feature of the analysis is that it may allow a root cause, e.g. a specific type of failure or power system operation, to be associated with the power system event. Furthermore, because the analytical method can examine events involving relatively small magnitudes, it can identify failures or other significant events while they are still incipient. In many cases, this allows repairs or component replacements to be scheduled before a failure causes a customer interruption, outage or other problem.

When the analysis is complete, the data window 100 is labeled to indicate at least one of the following: the cause of the event, the type of apparatus believed involved, the position of the apparatus within the electrical distribution system, contextual data, or a combination thereof. As used herein, the term "label" refers to identifying information that associated with a data group such as the window of interest that can be to a term, phrase, sequence of one or more characters, such as numbers or letters, position in a data table, or the like that can be associated with the window of interest. It is also possible that no specific cause is able to be identified, in which case no label need be applied.

Failures may or may not be apparent through analysis of a single data window. Therefore, analysis may take into account multiple data windows 100 stored at regular or irregular intervals. In such cases, differences or similarities in data from one data window 100 to the next may be a significant indicator of a particular type of failure. Also, evaluation of multiple windows 100 can be used as a confirmation technique. For example, if several data windows are labeled similarly or the same, it can be assumed that the failure is more likely to be correctly identified.

Optionally, once a failure cause has been associated with the event or a sequence of events, an authority may be notified. This may be accomplished by sending an audible alert, a visual alert, recording the power system event in a data file, or sending a facsimile, telephone, or pager alert, or an e-mail to a selected email address. The timing and distribution of the notification may be tailored to the type and/or severity of the failure, incipient failure, or other undesirable event(s).

Optionally, once a root cause has been associated with the event, a remedial action may be suggested. For example, a table or database may list possible repairs and/or equipment replacements known to be appropriate for particular types of failure.

The foregoing has described a method and system for anticipating and detecting failures and other events on a power system. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method for analyzing an electrical power system which includes at least one line carrying electrical power between a generating station and a customer, comprising:
   (a) acquiring data representing one or more line parameters of the electrical power being carried on the electrical power system;
   (b) using an electronic computing device, identifying a power system event within the data by:
      (1) establishing one or more selection criteria;
      (2) evaluating the data to determine if the one or more selection criteria are satisfied,
      (3) when one or more of the criteria are satisfied, declaring that a power system event is present; and
      (4) storing a data window representing a portion of the data containing the power system event;
   (c) using the computing device, analyzing the data contained in the data window;
   (d) based on the analysis, associating the power system event with a root cause from among a plurality of possible root causes, where the root cause is an incipient or actual failure within the electrical power system; and
   (e) using the computing device, suggesting a remedial action for the electrical power system consistent with the type of incipient or actual failure determined to be present.

2. The method of claim 1 wherein a plurality of power system events are analyzed.

3. The method of claim 2 wherein the root cause is determined, at least in part, based on a comparison among two or more power system events.

4. The method of claim 1 wherein the determination of the root cause is confirmed based on an analysis of one or more subsequent power system events.

5. The method of claim 1 wherein the data window represents a portion of the data occurring before and after the time of the power system event.

6. The method of claim 1 further comprising storing with the data window a label which indicates at least one of the following: the root cause of the event, the type of device, the position of the device within the electrical distribution system, and contextual data.

7. The method of claim 6, wherein the contextual data is selected from the group consisting of: weather, humidity, the presence of particulate matter, and combinations thereof.

8. The method of claim 1 wherein the data represents a derived parameter.

9. The method of claim 1 further comprising, after step (b), transmitting to an authority a notification that an incipient or actual failure is present in the electrical power system.

10. A computer program product comprising one or more non-transitory computer readable media having stored thereon a plurality of instructions that, when executed by one or more processors of a system, causes the one or more processors to:
   (a) acquire data representing one or more line parameters of electrical power being carried on an electrical power system which includes at least one line carrying electrical power between a generating station and a customer;
   (b) identify a power system event within the data by:
      (1) establishing one or more selection criteria;
      (2) evaluating the data to determine if the one or more selection criteria are satisfied,
      (3) when one or more of the criteria are satisfied, declaring that a power system event is present; and
      (4) storing a data window representing a portion of the data containing the power system event;
   (c) analyze the data contained in the data window;
   (d) based on the analysis, associate the power system event with a root cause from among a plurality of possible root causes, where the root cause is an incipient or actual failure within the electrical power system; and (e) suggest a remedial action for the electrical power system consistent with the type of incipient or actual failure determined to be present.

11. The computer program product of claim 10 wherein a plurality of power system events are analyzed.

12. The computer program product of claim 11 wherein the root cause is determined, at least in part, based on a comparison among two or more power system events.

13. The computer program product of claim 10 wherein the determination of the root cause is confirmed based on an analysis of one or more subsequent power system events.

14. The computer program product of claim 10 wherein the data window represents a portion of the data occurring before and after the time of the power system event.

15. The computer program product of claim 10 wherein the instructions further cause the at least one processor further to store with the data window a label which indicates at least one of the following: the root cause of the event, the type of device, the position of the device within the electrical distribution system, and contextual data.

16. The computer program product of claim 15, wherein the contextual data is selected from the group consisting of: weather, humidity, the presence of particulate matter, and combinations thereof.

17. The computer program product of claim 10 wherein the data represents a derived parameter.

18. The computer program product of claim 10 wherein the instructions further cause the at least one processor to transmit a notification to an authority that an incipient or actual failure is present in the electrical power system.

\* \* \* \* \*